United States Patent [19]

Beers et al.

[11] Patent Number: 5,580,669
[45] Date of Patent: Dec. 3, 1996

[54] OXIDATION RESISTANT COATING FOR TITANIUM ALLOYS

[75] Inventors: Russell A. Beers, Palm Beach Gardens; Douglas M. Berczik, North Palm Beach; Allan A. Noetzel, Palm Beach Gardens, all of Fla.

[73] Assignee: United Technologies Corporation, Hartford, Conn.

[21] Appl. No.: 546,232

[22] Filed: Oct. 20, 1995

Related U.S. Application Data

[63] Continuation of Ser. No. 198,004, Feb. 17, 1994, abandoned.
[51] Int. Cl.$^6$ .............................. B32B 15/00; F01D 5/28
[52] U.S. Cl. ..................... 428/660; 428/674; 428/938; 427/405
[58] Field of Search .................... 428/660, 674, 428/938; 427/405, 250

[56] References Cited

U.S. PATENT DOCUMENTS

| | | | |
|---|---|---|---|
| 2,856,333 | 10/1958 | Topelian | 204/29 |
| 2,992,135 | 7/1961 | Finlay | 117/114 |
| 3,045,333 | 7/1962 | Finlay | 428/660 |
| 3,341,369 | 9/1967 | Caule et al. | 148/3 |
| 3,765,954 | 10/1973 | Tokuda et al. | 148/20.3 |
| 4,137,370 | 1/1979 | Fujishiro et al. | 428/660 |
| 4,305,998 | 12/1981 | Manty et al. | 428/660 |
| 4,433,005 | 2/1984 | Manty et al. | 427/38 |
| 4,600,479 | 7/1986 | Thoma et al. | 425/660 |
| 4,666,795 | 5/1987 | Kurahashi et al. | 428/674 |
| 4,951,735 | 8/1990 | Berczik | 164/138 |
| 5,176,762 | 1/1993 | Berczik | 148/407 |
| 5,292,596 | 3/1994 | Prieuff et al. | 428/660 |
| 5,312,696 | 5/1994 | Beers et al. | 428/660 |

FOREIGN PATENT DOCUMENTS 869197  5/1961  United Kingdom .......... 428/660

OTHER PUBLICATIONS

Sanderson and Scully, "The High–Temperature Oxidation of Some Oxidation–Resistant Copper–Based Alloys", Oxidation of Metals, vol. 3, No. 1, pp. 59–90, 1971. no month.

*Primary Examiner*—John Zimmerman

[57] ABSTRACT

A method is taught for preparing titanium alloys having high temperature oxidation resistance, whereby a coating of a copper bronze containing up to 10 percent aluminum and up to 6 percent silicon is applied to the titanium substrate by cathodic arc deposition or ion vapor deposition.

21 Claims, 8 Drawing Sheets fig. 1 fig.2 fig. 3 fig. 4 fig.5 fig. 6 fig. 7 fig. 8

OXIDATION RESISTANT COATING FOR TITANIUM ALLOYS

The invention was made under a U.S. Government contract and the Government has rights herein.

This is a continuation of Ser. No. 08/198,004, filed on Feb. 17, 1994 (now abandoned).

DESCRIPTION

1. Technical Field of the Invention

This invention relates to the application of a coating to a titanium alloy substrate to increase its oxidation resistance, and thereby its high temperature capability, without detriment to the mechanical properties of the titanium substrate.

2. Background of the Invention

Titanium alloys possess an ideal combination of strength and low density for many aerospace applications, including gas turbine engines, and particularly gas turbine engine compressor blades, vanes, and related hardware. However, titanium is a highly reactive metal and is subject to sustained combustion under conditions encountered in gas turbine engine compressors, where ambient air is compressed to pressures on the order of 400 psi at temperatures above 850° F. In addition, most titanium alloys suffer from reduced mechanical properties at such elevated temperatures.

Recent research in the field of titanium alloys has resulted in development of a family of alloys exhibiting usable mechanical properties up to at least 1200° F. These alloys are taught in U.S. Pat. No. 5,176,762, of Berczik, the contents of which are incorporated herein by reference as if reproduced in full below. Berczik defines a family of beta titanium alloys having exceptional high temperature strength properties in combination with an essential lack of combustibility, said alloys containing at least 10 percent (by weight) chromium, at least 20 percent vanadium, and at least 40 percent titanium, and containing sufficient chromium to be nonburning. A typical alloy of this type is titanium—35 percent vanadium—15 percent chromium. Oxidation becomes the limiting factor for alloys of this nature at temperatures above about 1000° F.

Existing technologies for improving the oxidation resistance of various alloys for use at elevated temperatures, such as nickel-based superalloys, include reliance upon locally increasing the aluminum content of the alloy at the surface by aluminization. Aluminizing titanium alloys in most cases, however, causes severe mechanical property debits, thus rendering them useless as structural materials for engineering application.

In U.S. Pat. No. 2,856,333, Topelian teaches the electroplating of aluminum, titanium, or other metals which are easily oxidized, with chromium, nickel, copper, or brass. Strong bonding of the substrate with the electroplate is achieved by conditioning it with a hydrogen chloride gas treatment to remove the oxide film normally present on the metal.

In U.S. Pat. No. 2,992,135, Finlay teaches the applications of coatings of aluminum, tin, copper, lead, and other metals to a titanium base to enhance the utility thereof at elevated temperatures, in such a manner that the coatings combine or alloy with the surface metal, thereby forming a permanently bonded protective and non-galling coating. Copper, for example, is applied by dipping in cuprous chloride, while aluminum, tin, or lead is applied from a molten bath of the metal.

In U.S. Pat. No. 3,765,954, Tokuda et al teach the preparation of surface-hardened titanium alloys by coating a substitutional metal, such as copper, thereupon and heating the coated metal in a nitrogen atmosphere to nitride the substitutional metal. A hardened layer is formed, which is richer in stable beta phase than the base metal.

Manty et al, in U.S. Pat. No. 4,433,005, teach the preparation of fatigue resistant titanium alloys, wherein ion implantation of noble metals or titanium is employed to increase the high temperature fatigue strength of titanium alloys. This reference also teaches that thermal oxidation of titanium at about 1100° F. may be inhibited by ion implantation of calcium, europium, cerium, yttrium, zinc, aluminum, indium, nickel, and bismuth, but that mere ion implantation is ineffective in plating titanium or titanium alloy components with an oxidation-resistant protective coating so as to provide improved mechanical properties in gas turbine compressor environments.

In addition to the above, Caule et al teach, in U.S. Pat. No. 3,341,369, various copper based alloys, and methods for the preparation thereof. The reference is directed to the formation of copper alloys having resistance to oxidation as a result of the discrete dispersion of a complex oxide in a subsurface layer. The patent, however, does not suggest use of the copper alloy as a coating.

SUMMARY OF THE INVENTION

The present invention relates to the application of an oxidation resistant copper bronze as a coating to a titanium substrate. Suitable copper bronzes fall into three categories: copper-aluminum bronzes, typified by copper—8 percent aluminum (Cu-8Al), which contain minor amounts of aluminum, wherein the aluminum is present in sufficient quantity to form a protective alumina or cupric aluminate scale; copper-silicon bronzes, typified by copper—4 percent silicon (Cu-4Si), which form a protective silica or cupric silicate scale; and copper-aluminum-silicon bronzes, which in general form an alumina or cupric aluminate scale. Exemplary coating materials of the copper-aluminum-silicon class of bronzes include copper—4 percent aluminum—3 percent silicon (Cu-4Al-3Si), copper—3 percent aluminum—2 percent silicon (Cu-3Al-2Si), copper—7 percent aluminum—3.5 percent silicon (Cu-7Al-3.5Si), and copper—4 percent aluminum—2 percent silicon (Cu-4Al-2Si). All compositions herein are given in weight percent. The compositions of these copper alloys are broadly within a range wherein the alloy is comprised of copper and from 0 to 10 percent aluminum and from 0 to 6 percent silicon, provided that the percentages of aluminum and silicon are not simultaneously zero. In general, it has been found that when both aluminum and silicon are present, the ratio of aluminum to silicon should be greater than 1:1 for optimum performance. For a review of oxidation resistant copper alloys, see M. D. Sanderson and J. C. Scully, "The High Temperature Oxidation of Some Oxidation Resistant Copper Alloys", Oxidation of Metals, Vol.3, No. 1, pp. 59–90, 1971.

The copper alloy coating may be applied by ion vapor deposition or by cathodic arc deposition to ensure high density, while maintaining a low part temperature to inhibit diffusion and the subsequent formation of intermetallic compounds. Cathodic arc deposition is a more costly process than ion vapor deposition, but produces a higher density coating with better adhesion to the substrate than ion vapor deposition, which results in greater oxidation resistance. Further, cathodic arc deposition is more capable of depositing uniform coatings of complex alloys on irregular surfaces.

The invention further comprises a method for extending the high temperature capabilities of titanium to temperatures at which oxidation has previously been an inhibiting factor. For example, when applied to a nonburning titanium alloy such as Ti-35V-15Cr, a coating in accordance with the invention extends the useful range of the alloy to about 1250° F.

DESCRIPTION OF THE PREFERRED EMBODIMENTS

The present invention relates to the application of copper bronze coatings containing aluminum, silicon, or both, to titanium alloy substrates to improve high temperature oxidation characteristics. When the bronze is a copper-aluminum bronze, the alloy preferably contains from 4 to 10 percent aluminum. When the coating is a copper-silicon bronze, it preferably contains 3 to 6 percent silicon. When the alloy contains both aluminum and silicon, it preferably contains from 1 to 10 percent aluminum and from 1 to 5 percent silicon. While the specification is specific to the use of beta-titanium alloys comprising at least 10 percent chromium, at least 20 percent vanadium, and at least 40 percent titanium, with sufficient chromium to be nonburning, the invention is believed to encompass all titanium alloys coated with a copper-aluminum, copper-silicon or copper-aluminum-silicon bronze. A typical titanium alloy to which the invention is applicable is titanium—35 percent vanadium—15 percent chromium. The preferred method for application of the copper coating is by cathodic arc deposition, or alternatively, ion vapor deposition. Such deposition methods are preferred because they allow one to ensure high density of the coating, while not requiring the substrate to be heated to a high temperature, thus inhibiting formation and diffusion of intermetallic compounds in the substrate. The preferred method for application comprises cathodic arc deposition, followed by glass bead peening to smooth the surface (resulting in less total surface area and improved oxidation resistance).

The invention is applicable to any titanium alloy substrate, but is particularly useful for titanium alloys having high temperature capabilities, such as the beta titanium alloys set forth in U.S. Pat. No. 5,176,762, of Berczik, incorporated herein by reference. Such alloys comprise the beta phase of titanium under all temperature conditions, have strengths much in excess of prior high strength alloys, and have excellent creep properties. Moreover, such alloys are nonburning under conditions encountered in gas turbine engine compressor sections. Such beta titanium alloys are based on ternary compositions of titanium-vanadium-chromium which occur in the titanium-vanadium-chromium phase diagram bounded by the points Ti-22V-13Cr, Ti-22V-36Cr, and Ti-40V-13Cr. Such alloys have creep strength exceeding that of such commercial alloys as Ti-6-2-4-2 at elevated temperatures, and are nonburning under conditions typical of those encountered in gas turbine engine compressor applications. A variety of nondeleterious quaternary and higher alloying elements may be added to the above basic composition to modify the alloy properties without negating the high creep strength and nonburning attributes.

Alternatively, the composition of such titanium alloys may be described as being a beta phase titanium alloy essentially free from the alpha phase and $TiCr_2$, containing more than 10 percent chromium, more than about 20 percent vanadium, and more than about 40 percent titanium, located on the titanium rich side of the low melting point trough and on the vanadium rich side of the beta-beta plus gamma phase boundary. It is to be noted that minor amounts of alpha phase titanium and $TiCr_2$ may be tolerated in nondeleterious quantities of about 3 percent. More than about 3 percent of the gamma ($TiCr_2$) or alpha phase would be detrimental to alloy mechanical properties, and especially ductility. It is also important that the alloy contain more than about 10 percent chromium, since it has been found that about 13 percent chromium is necessary to provide the desired nonburning characteristics.

Evidence exists that cobalt, copper, iron, manganese, molybdenum, nickel, silicon and gallium will aid in increasing the resistance to burning of these alloys. Boron, beryllium, chromium, niobium, rhenium, silicon, tin and bismuth are all believed to have the potential to increase the oxidation resistance of the material. Boron, beryllium, carbon, cobalt, iron, manganese, molybdenum, niobium, nickel, oxygen, silicon, tin, tantalum, vanadium, tungsten, zirconium, gallium and hafnium all have the potential to increase the mechanical properties of the material. In particular, carbon has been demonstrated to improve the post-creep ductility of the alloy without adversely affecting the room temperature tensile ductility. Such compositions may be fabricated using conventional titanium metallurgy technology such as Vacuum Arc Remelting and skull melting techniques. The use of carbon for metal contacting surfaces, as set forth by Berczik in U.S. Pat. No. 4,951,735, which is incorporated herein by reference as if reproduced in full below, is particularly advantageous.

Preferred alloys falling within the scope of the alloy as described above include Ti-35V-15Cr, Ti-35V-15Cr-0.15C, Ti-35V-15Cr-0.625C, Ti-30Cr-0.625C, Ti-35V-15Cr-2Si, Ti-33.5V-15.5Cr-3.6Cb, Ti-25V-35Cr-5Al, and Ti-35V-15Cr-0.5Hf-0.75C. As noted above, and as set forth in the aforementioned U.S. Pat. No. 5,176,762, the preferred beta phase alloys to which the present invention is particularly applicable may comprise greater than about 10 percent chromium, greater than about 20 percent vanadium, up to about 0.6 percent boron, up to about 4 percent beryllium, up to about 2.5 percent carbon, up to about 7 percent cobalt, up to about 4 percent iron, up to about 7 percent manganese, up to about 12 percent molybdenum, up to about 12 percent niobium, up to about 12 percent nickel, up to about 0.3 percent oxygen, up to about 1.5 percent rhenium, up to about 2.5 percent silicon, up to about 2.5 percent tin, up to about 1.5 percent tantalum, up to about 2.5 percent tungsten, up to about 5 percent zirconium, up to about 1.5 percent bismuth, up to about 2.5 percent gallium, and up to about 1.5 percent hafnium, the balance essentially titanium in an amount of at least 40 percent.

The oxidation resistant coating applied in accord with the present invention is comprised of a copper bronze, preferably selected from the group consisting of copper plus from about 4 to 10 percent aluminum, copper plus from about 3 to 6 percent silicon, and copper plus from about 1 to 10 percent aluminum plus from about 1 to 5 percent silicon. The coating may be applied by any coating technique which will permit application of a fully dense, uniform coating layer, while maintaining the temperature of the substrate at a temperature below about 1200° F. The preferred coating techniques include ion vapor deposition and cathodic arc deposition. In this manner, complex shapes may be coated uniformly, while the formation of intermetallics, and the diffusion thereof into the substrate, are minimized. Other deposition methods include, but are not limited to, sputtering and electron beam physical vapor deposition. Cathodic arc deposition produces a fully dense coating. The desired thickness of the coating is set by the temperature and time of exposure for each application but in general a coating thickness should be between 0.5 and 2.0 mils. A major benefit of these coatings over earlier efforts to protect titanium alloys is their ability to protect the substrate from oxidation while causing little or no decrease in high cycle fatigue life. This is in direct contrast with aluminide coatings which can cause fatigue life debits of several orders of magnitude. An ion deposited coating of Cu-8Al on titanium—35 percent vanadium—15 percent chromium caused no decrease in fatigue life at room temperature and only a 7 percent reduction in life at 1000° F.

EXAMPLE 1

Samples of a substrate comprising the titanium alloy Ti-35V-15Cr were coated with a bronze comprising Cu-8Al, by ion vapor deposition and by cathodic arc deposition. For ion vapor deposition, the chamber was evacuated to less than $1 \times 10^{-5}$ torr and backfilled to 5 to 20 microns with high purity argon gas. Cu-8Al wire was fed into the crucibles. The parts to be coated were hung above these crucibles and were charged at between minus 1000 and minus 2000 volts D.C. The Cu-8Al evaporant had about 0.5 to 2 percent ionization. This resulted in a columnar structure in the coating. The coating was then lightly peened with a 50 mil glass bead slurry at 30 psi until a shiny surface finish was achieved. For cathodic arc deposition, the chamber was evacuated to a pressure of less than $1 \times 10^{-5}$ torr and backfilled to 5 to 20 microns with high purity argon gas. The Cu-8Al was evaporated from solid plate cathodes using a low-voltage, high current electric arc. This resulted in an evaporant that was 75 to 95 percent ionized. The parts were charged to 5 to 100 Volts. The highly ionized nature of the evaporant and high average energy of arriving atoms (50 to 100 Ev) produced a fully dense and very adherent coating. The structure of the coating was equiaxed fine grains and had a surface finish similar to the original surface. The oxidation resistance of this coating was superior to the same material ion deposited and peened. It was still further improved by lightly peening the coating with a 50 mil glass bead slurry at 30 psi until a shiny surface finish was achieved.

Figure 1:
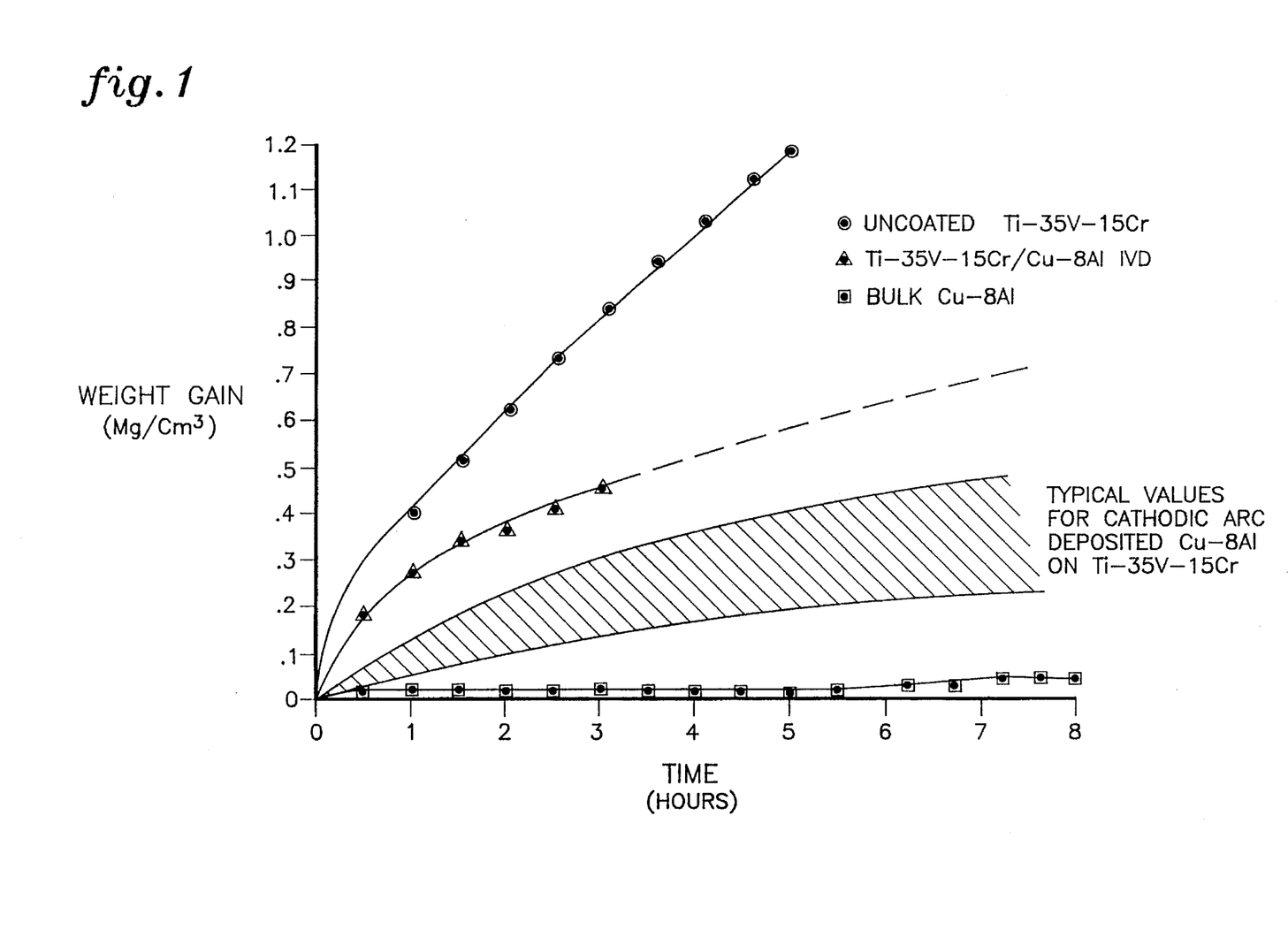
FIG. 1 is a graph showing the thermogravimetric analysis of various materials at 1200° F., demonstrating the oxidation resistance of a titanium alloy coated in accordance with the present invention.
Figure 2:
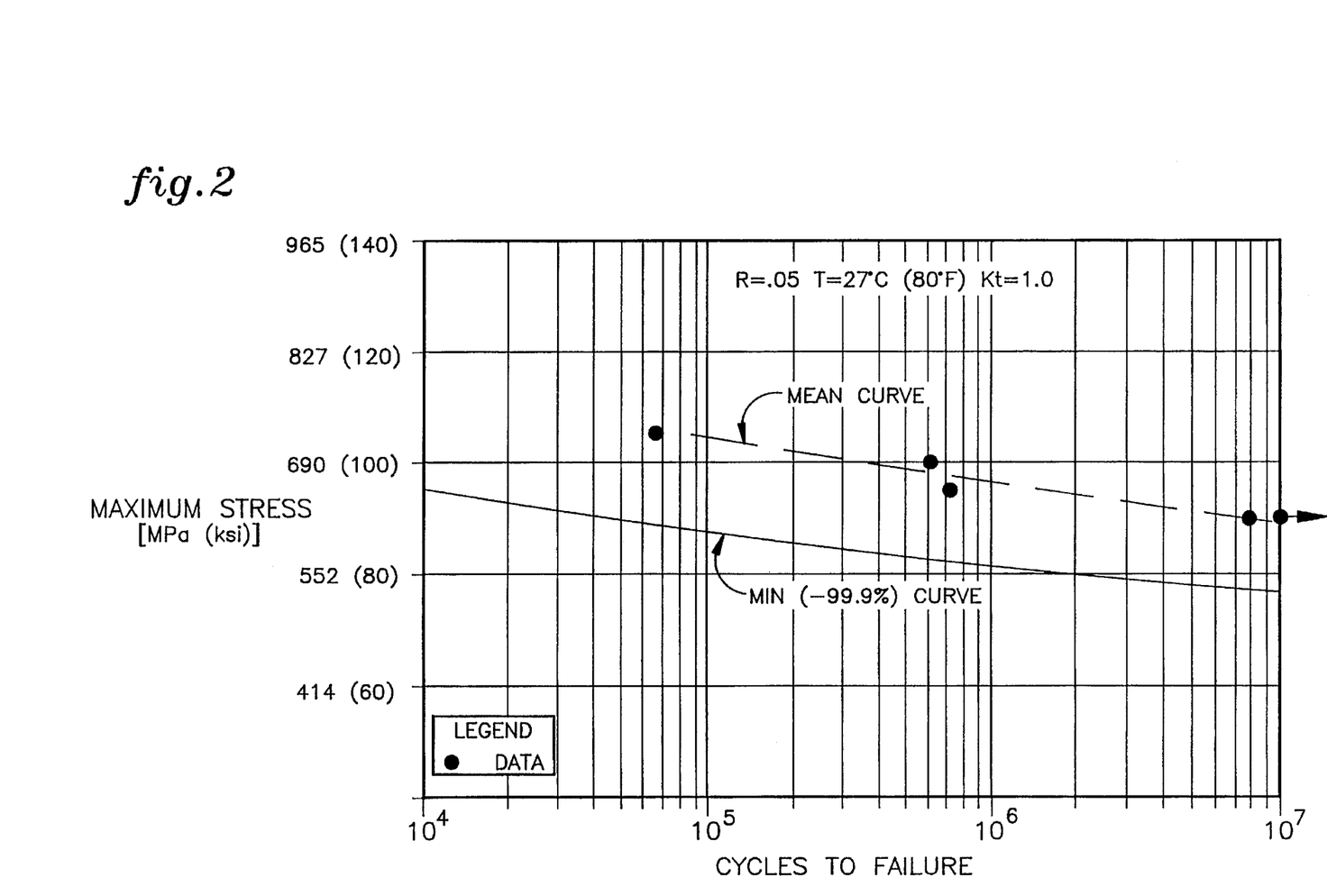
FIGS. 2 through 8 are graphical demonstrations of axial high cycle fatigue results.
Figure 3:
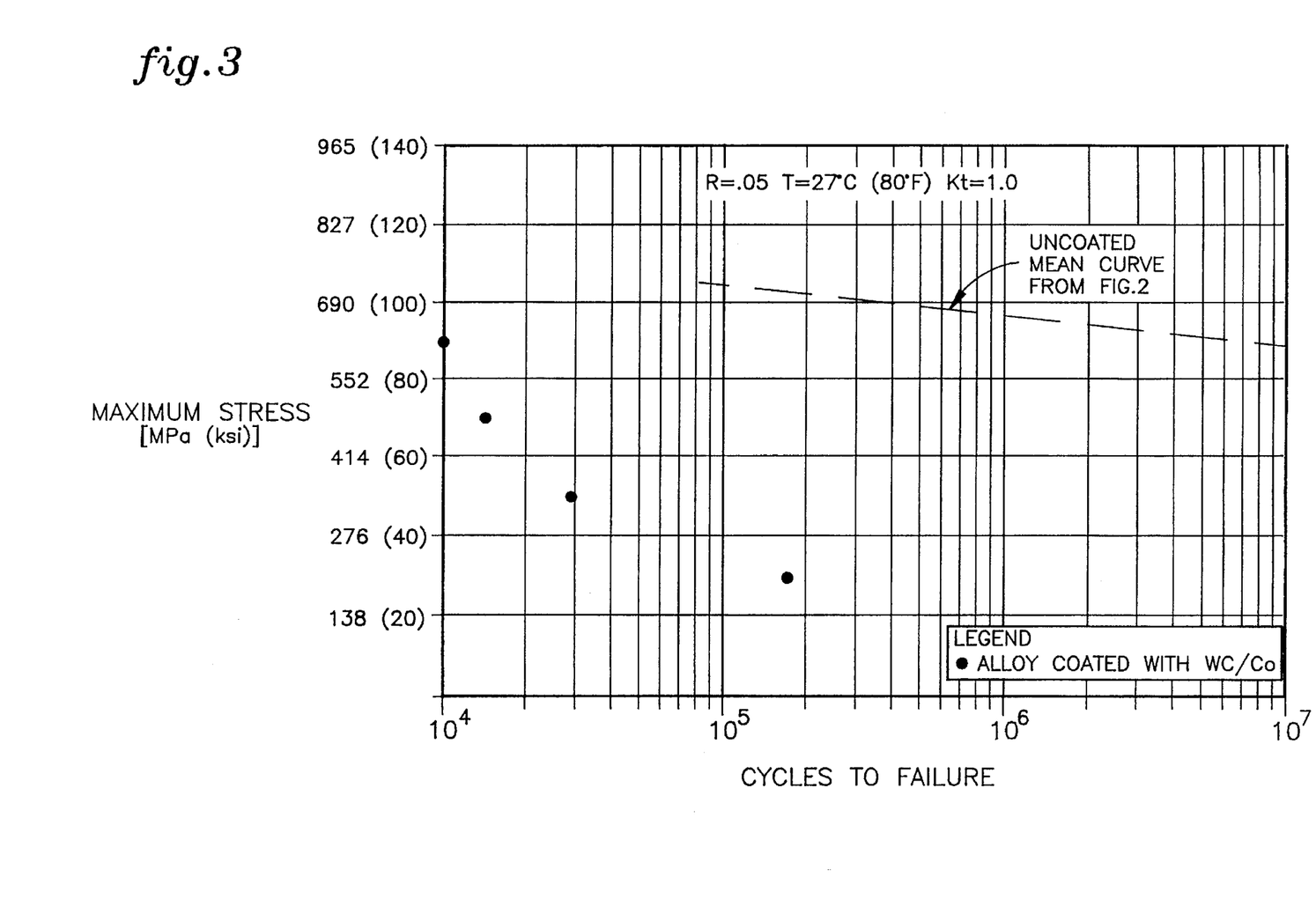
Figure 4:
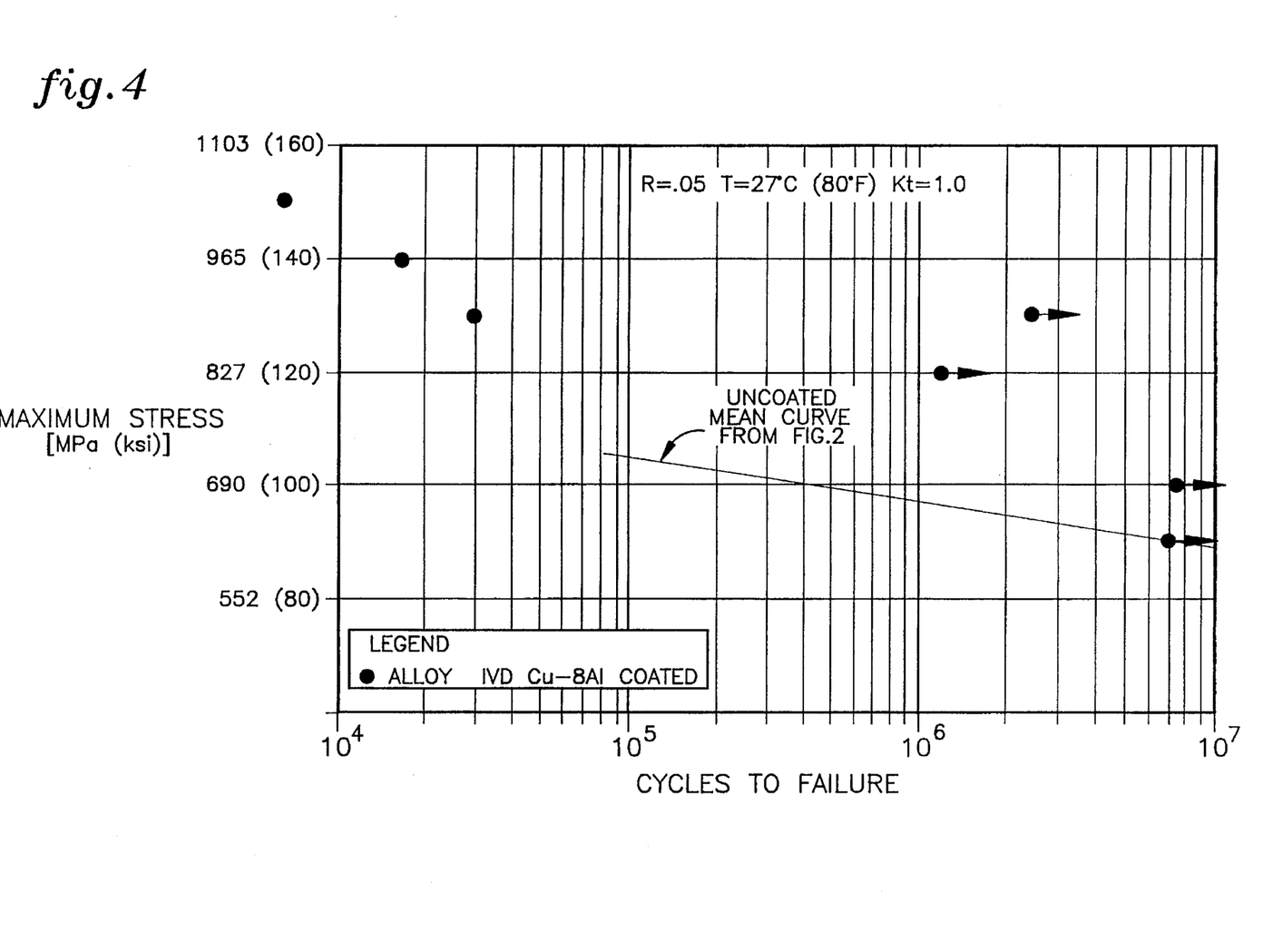
Figure 5:
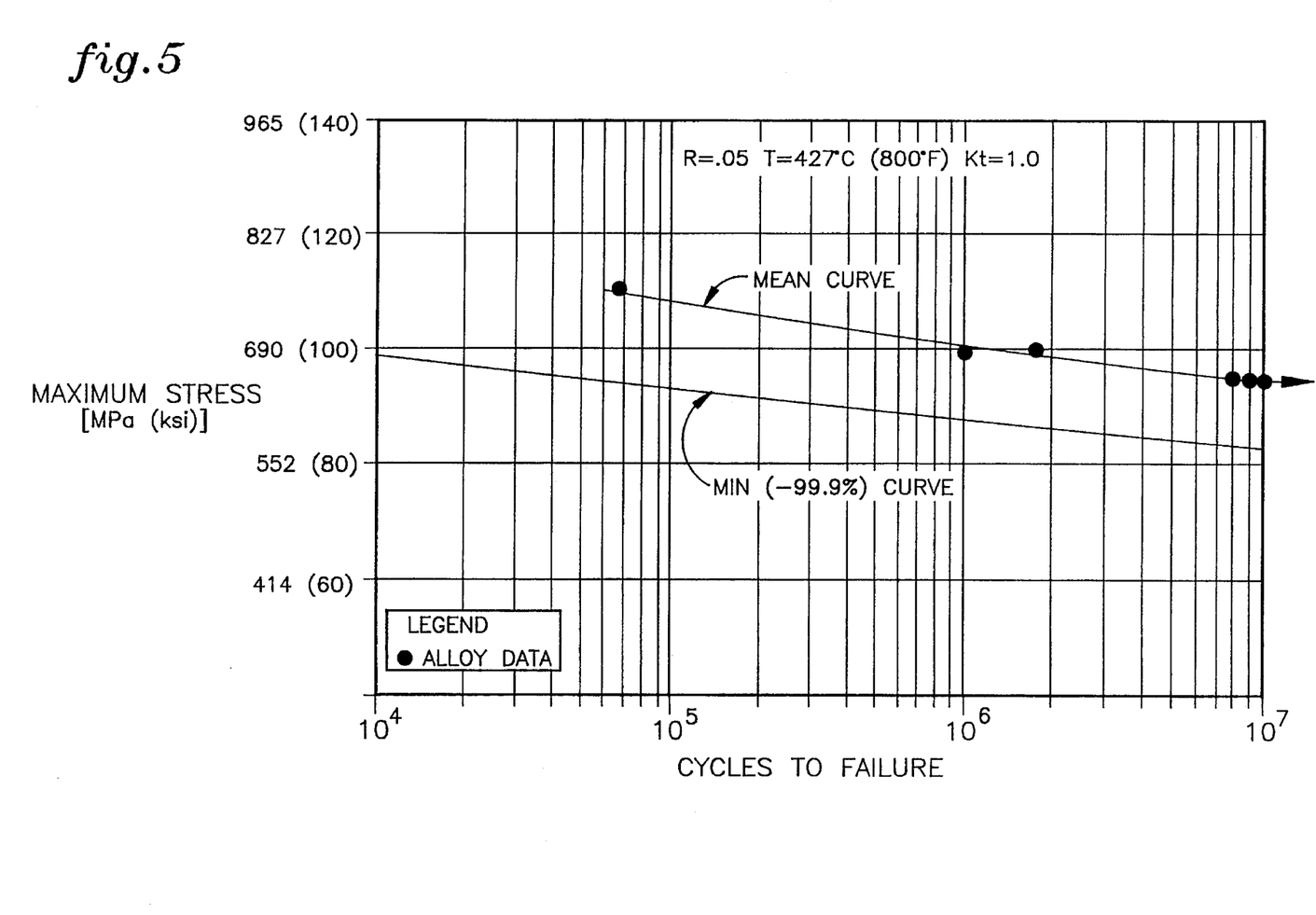
Figure 6:
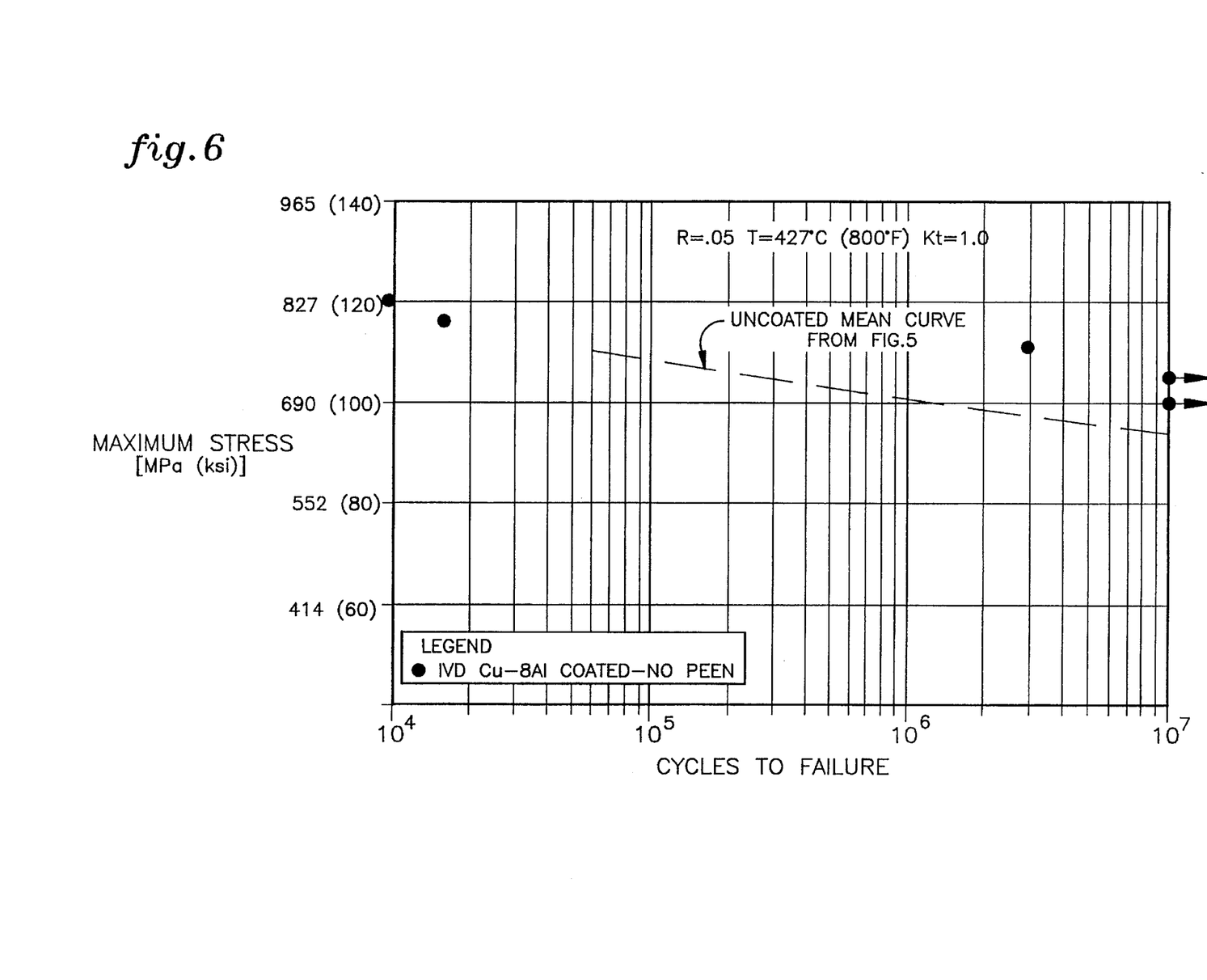
Figure 7:
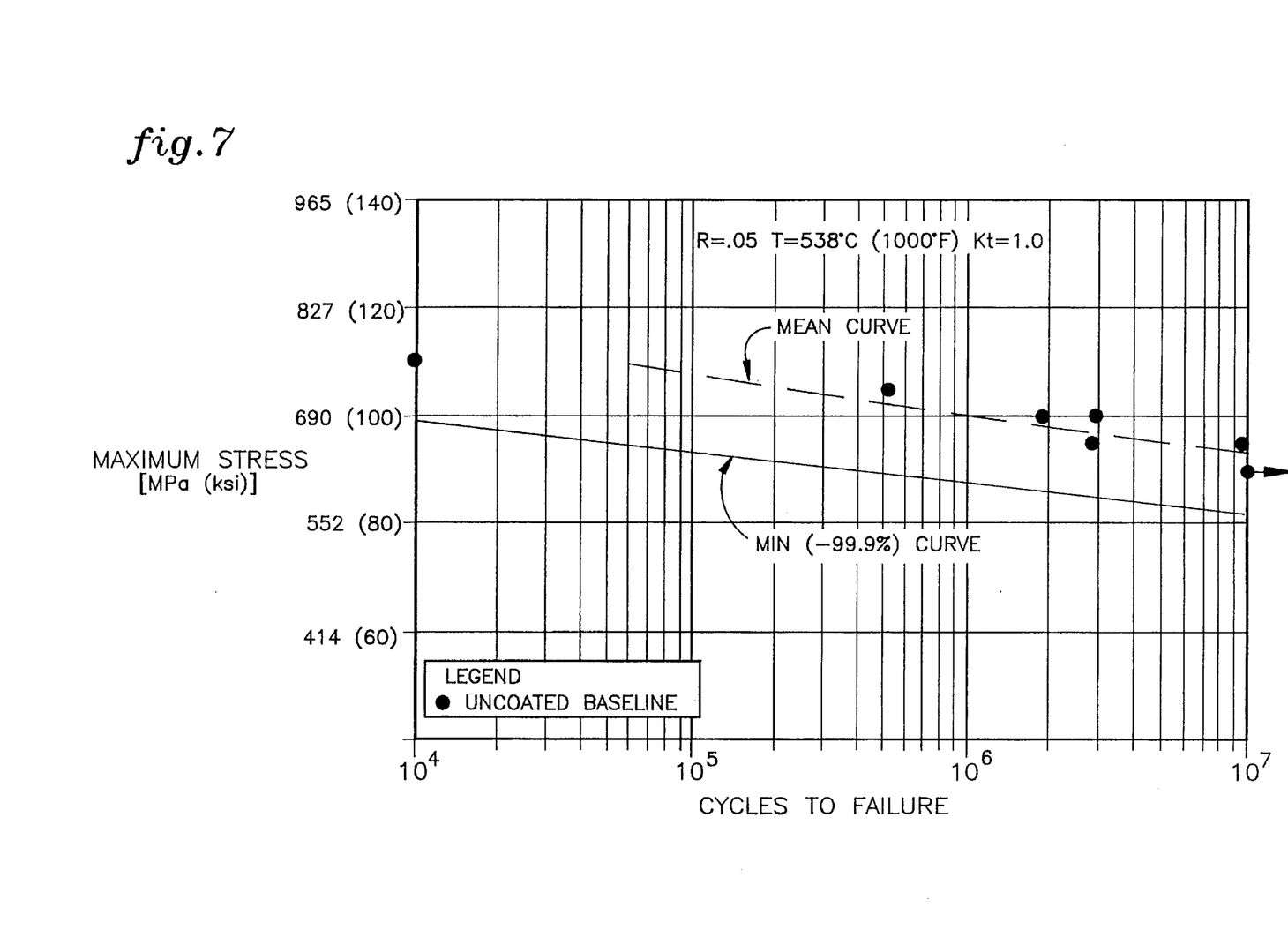
Figure 8:
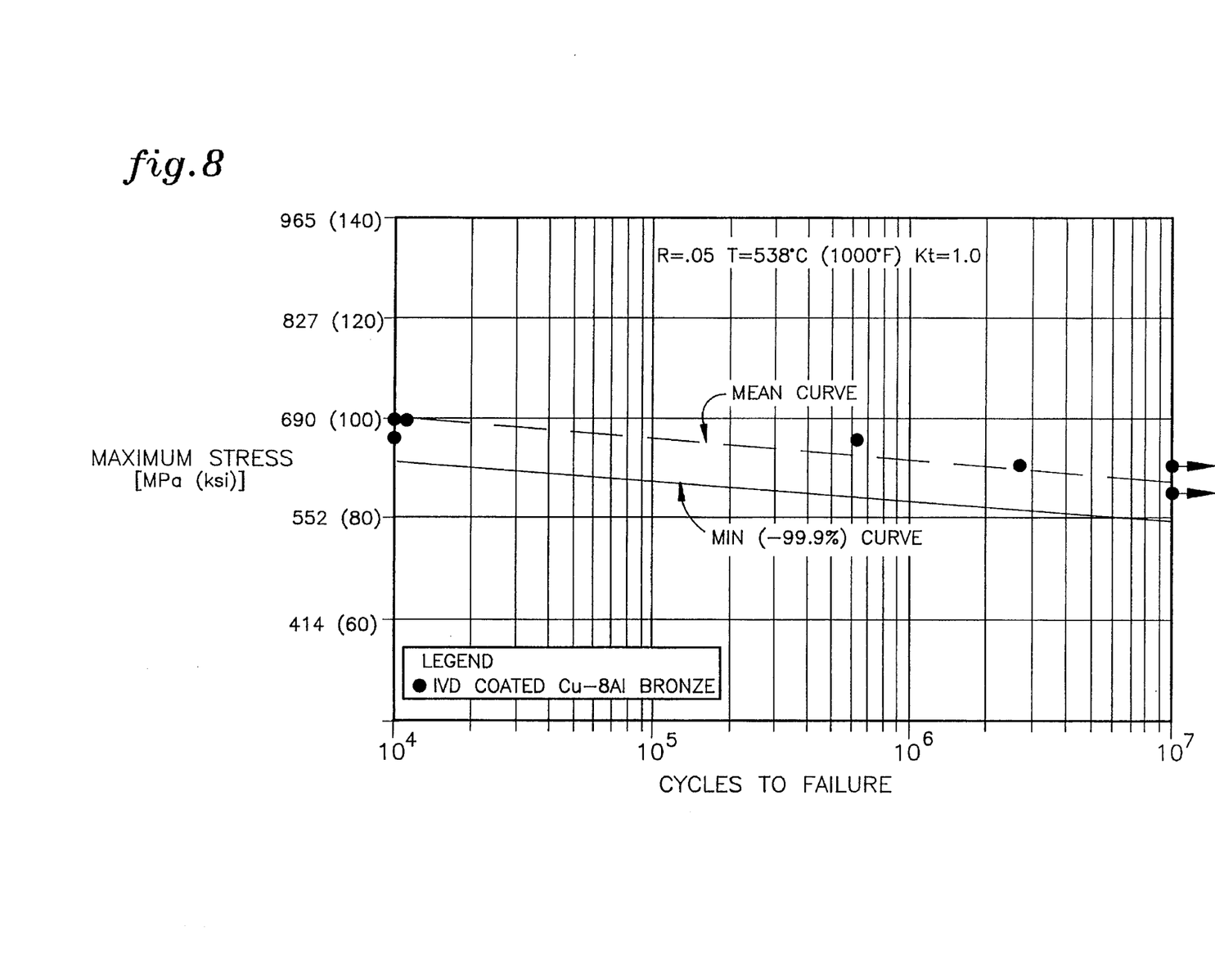

FIG. 1 illustrates the present invention, by showing the weight gain of various substrates under oxidation conditions at 1200° F. over time. The graph clearly indicates the relatively rapid oxidation of an unprotected Ti-35V-15Cr alloy. This is easily compared to the rate of oxidation of bulk Cu-8Al, and for the same alloy coated with Cu-8Al by either ion vapor deposition or by the preferred method of cathodic arc deposition followed by glass bead peening.

EXAMPLE 2

High temperature oxidation tests were conducted on a number of titanium alloy substrates, both uncoated and coated in accordance with the present invention. The scale thickness above either the uncoated titanium alloy substrate surface or the coating surface was measured, as being indicative of the extent of oxidation occurring. In addition, the "affected zone" was measured, as indicative of either the depletion of the surface titanium in the uncoated alloy specimens, or the depth of diffusion of the coating into the surface zone of the coated specimens. All measurements were in mils. The results of these tests are set forth in Table I, wherein Alloy 1 comprises Ti-35V-15Cr, Alloy 2 comprises Ti-6Al-4Sn-3.5Zr-0.7Nb-0.5Mo-0.35Si, and Alloy 3 comprises Ti-15Mo-2.7Nb-3Al-0.2Si-0.15 O.

TABLE I

| ALLOY | COATING | TIME (HRS) | TEMP °F. | SCALE MILS | ZONE MILS |
|---|---|---|---|---|---|
| 1 | NONE | 50 | 1200 | 1.1 | 1.0 |
| 1 | NONE | 200 | 1200 | 2.55 | 1.0 |
| 1 | NONE | 490 | 1200 | 4.7 | 0.9 |
| 1 | Cu—8Al | 200 | 1200 | 0.1 | 0.5 |
| 1 | Cu—4Si | 200 | 1200 | 0.15 | 0.15 |
| 1 | Cu—4Al—3Si | 200 | 1200 | 0.1 | 0.1 |
| 2 | Cu—4Al—3Si | 200 | 1200 | 0.1 | 0.25 |
| 3 | Cu—8Al | 50 | 1300 | 0.2 | 1.0 |

From Table I, it may readily be seen that the oxidation of Alloy 1, Ti-35V-15Cr, is reduced considerably by coatings of Cu-8Al, Cu-4Si, and Cu-4Al-3Si. This beneficial oxidation resistance is also evident in both Alloy 2, coated with Cuo4Al-3Si, and Alloy 3, coated with Cu-8Al. It may also be seen that the coated samples of Alloy 1 exhibit less of an Affected Zone than the uncoated samples. Of the coating materials applied to Alloy 1, the Cu-8Al coating appears to have the greatest Affected Zone.

EXAMPLE 3

High cycle fatigue testing of Ti-35V-15Cr specimens was conducted with various coating applications. Smooth specimens were tested axially on load controlled, servo-hydraulic fatigue testing machines and run to failure or to ten million cycles ($10^7$ cycles). All testing was conducted with the stress ratio (R) equalling 0.05. The substrates used for both coated and uncoated specimens were identical. The results of these tests are set forth in Tables II and III, with Table II relating to room temperature test, and Table III relating to high temperature testing. The WC/Co coating comprised a matrix of cobalt with particulate tungsten carbide, applied 4–6 mils thick, by detonation gun. The Cu-8Al coatings were applied by ion vapor deposition, 1–1.5 mils thick.

TABLE II

| NO. | COAT | °F. | KSI | CYCLES | FAIL? | FIG. |
|---|---|---|---|---|---|---|
| 18 | NONE | 80 | 105 | $6.74 \times 10^4$ | YES | 2 |
| 73 | NONE | 80 | 100 | $6.32 \times 10^5$ | YES | 2 |
| 22 | NONE | 80 | 95 | $7.14 \times 10^5$ | YES | 2 |
| 24 | NONE | 80 | 90 | $7.84 \times 10^6$ | THREAD | 2 |
| 67 | NONE | 80 | 90 | $1.00 \times 10^7$ | NO | 2 |
| 12 | NONE | 80 | 70 | $1.00 \times 10^7$ | NO | 2 |
| 29 | WC/Co | 80 | 90 | $9.10 \times 10^3$ | YES | 3 |
| 62 | WC/Co | 80 | 70 | $1.39 \times 10^4$ | YES | 3 |
| 57 | WC/Co | 80 | 50 | $2.94 \times 10^4$ | YES | 3 |
| 45 | WC/Co | 80 | 30 | $1.65 \times 10^5$ | YES | 3 |
| 25 | Cu—8Al | 80 | 150 | $6.10 \times 10^3$ | YES | 4 |

TABLE II-continued

| NO. | COAT  | °F. | KSI | CYCLES           | FAIL?  | FIG. |
|-----|-------|-----|-----|------------------|--------|------|
| 46  | Cu—8Al | 80  | 140 | $1.65 \times 10^4$ | YES    | 4    |
| 31  | Cu—8Al | 80  | 130 | $2.97 \times 10^4$ | YES    | 4    |
| 25  | Cu—8Al | 80  | 130 | $2.46 \times 10^6$ | NO     | 4    |
| 65  | Cu—8Al | 80  | 120 | $1.29 \times 10^6$ | THREAD | 4    |
| 46  | Cu—8Al | 80  | 100 | $7.55 \times 10^6$ | NO     | 4    |
| 25  | Cu—8Al | 80  | 90  | $7.08 \times 10^6$ | NO     | 4    |

TABLE III

| NO. | COAT   | °F.  | KSI | CYCLES             | FAIL?  | FIG. |
|-----|--------|------|-----|--------------------|--------|------|
| 10  | NONE   | 800  | 110 | $6.65 \times 10^4$ | YES    | 5    |
| 69  | NONE   | 800  | 100 | $1.01 \times 10^6$ | YES    | 5    |
| 43  | NONE   | 800  | 100 | $1.82 \times 10^6$ | THREAD | 5    |
| 38  | NONE   | 800  | 95  | $1.00 \times 10^7$ | NO     | 5    |
| 35  | NONE   | 800  | 95  | $1.00 \times 10^7$ | NO     | 5    |
| 58  | NONE   | 800  | 95  | $1.00 \times 10^7$ | NO     | 5    |
| 16  | Cu—8Al | 800  | 140 | $3.00 \times 10^3$ | YES    | 6    |
| 32  | Cu—8Al | 800  | 120 | $7.80 \times 10^3$ | YES    | 6    |
| 75  | Cu—8Al | 800  | 115 | $1.60 \times 10^4$ | YES    | 6    |
| 49  | Cu—8Al | 800  | 110 | $2.85 \times 10^6$ | NO     | 6    |
| 70  | Cu—8Al | 800  | 105 | $1.00 \times 10^7$ | NO     | 6    |
| 16  | Cu—8Al | 800  | 100 | $1.00 \times 10^7$ | NO     | 6    |
| 7   | NONE   | 1000 | 110 | $6.30 \times 10^3$ | YES    | 7    |
| 20  | NONE   | 1000 | 105 | $5.28 \times 10^5$ | YES    | 7    |
| 23  | NONE   | 1000 | 100 | $1.90 \times 10^6$ | YES    | 7    |
| 24  | NONE   | 1000 | 100 | $2.88 \times 10^6$ | YES    | 7    |
| 25  | NONE   | 1000 | 95  | $2.80 \times 10^6$ | YES    | 7    |
| 10  | NONE   | 1000 | 95  | $9.51 \times 10^6$ | YES    | 7    |
| 27  | NONE   | 1000 | 90  | $1.00 \times 10^7$ | NO     | 7    |
| 1   | Cu—8Al | 1000 | 100 | $9.00 \times 10^3$ | YES    | 8    |
| 2   | Cu—8Al | 1000 | 100 | $1.09 \times 10^4$ | YES    | 8    |
| 14  | Cu—8Al | 1000 | 95  | $8.60 \times 10^3$ | YES    | 8    |
| 19  | Cu—8Al | 1000 | 95  | $6.13 \times 10^5$ | YES    | 8    |
| 28  | Cu—8Al | 1000 | 90  | $2.62 \times 10^6$ | YES    | 8    |
| 22  | Cu—8Al | 1000 | 90  | $1.00 \times 10^7$ | NO     | 8    |
| 12  | Cu—8Al | 1000 | 85  | $1.00 \times 10^7$ | NO     | 8    |

As may be seen upon examination of the data, the use of the Cu-8Al coatings in accordance with the present invention resulted in little or no fatigue strength debit, as compared to the coating applied by detonation gun. These results are also shown in graphical form in FIGS. 2–8.

Although this invention has been shown and described with respect to detailed and preferred embodiments thereof, it will be understood by those skilled in the art that various changes and modifications therein may be made without departing from the spirit and scope of the claimed invention.

What is claimed is:

1. A method for improving the oxidation resistance of a titanium alloy substrate, said method comprising applying to said substrate a uniform coating of a copper alloy selected from the group consisting of copper plus from about 4 to 10 percent aluminum, copper plus from about 3 to 6 percent silicon, and copper plus from about 1 to 10 percent aluminum plus from about 1 to 5 percent silicon, at a substrate temperature below about 1200° F. to inhibit diffusion of coating constituents into the substrate and subsequent formation of intermetallic compounds in the substrate.

2. A method as set forth in claim 1, wherein said substrate comprises a beta phase titanium alloy essentially free from the alpha phase and TiCr$_2$, containing more than 10 percent chromium, more than about 20 percent vanadium, and more than about 40 percent titanium.

3. A method as set forth in claim 2, wherein said coating is applied by ion vapor deposition.

4. A method as set forth in claim 3, further comprising the step of peening the applied coating.

5. A method as set forth in claim 2, wherein said copper alloy is selected from the group consisting of Cu-8Al, Cu-4Si, Cu-4Al-3Si, Cu-3Al-2Si, Cu-7Al-3.5Si, and Cu-4Al-2Si.

6. A method as set forth in claim 3, wherein said substrate comprises 35 percent vanadium, 15 percent chromium, at least 40 percent titanium, and up to 10 percent quaternary alloying elements.

7. A method as set forth in claim 6, wherein said coating is selected from the group consisting of Cu-8Al, Cu-4Si, Cu-4Al-3Si, Cu-3Al-2Si, Cu-7Al-3.5Si, and Cu-4Al-2Si, and is applied by cathodic arc deposition.

8. A method as set forth in claim 6, wherein said coating is selected from the group consisting of Cu-8Al, Cu-4Si, Cu-4Al-3Si, Cu-3Al-2Si, Cu-7Al-3.5Si, and Cu-4Al-2Si, and is applied by ion vapor deposition.

9. A method as set forth in claim 2, wherein said coating is applied by cathodic arc deposition.

10. A method for improving the oxidation resistance of a titanium alloy substrate, wherein said substrate comprises a beta phase titanium alloy essentially free from the alpha phase and TiCr$_2$, containing more than 10 percent chromium, more than about 20 percent vanadium, and more than about 40 percent titanium, said method comprising applying to said substrate a fully dense, uniform coating of a copper alloy selected from the group consisting of copper plus from about 4 to 10 percent aluminum, copper plus from about 3 to 6 percent silicon, and copper plus from about 1 to 10 percent aluminum plus from about 1 to 5 percent silicon, at a substrate temperature below about 1200° F. to inhibit diffusion of coating constituents into the substrate and subsequent formation of intermetallic compounds in the substrate.

11. A method as set forth in claim 10, wherein said coating is applied by cathodic arc deposition and subjected to peening.

12. A method as set forth in claim 11, wherein said substrate comprises 35 percent vanadium, 15 percent chromium, at least 40 percent titanium, and up to 10 percent quaternary alloying elements, and said copper alloy is selected from the group consisting of Cu-8Al, Cu-4Si, Cu-4Al-3Si, Cu-3Al-2Si, Cu-7Al-3.5Si, and Cu-4Al-2Si.

13. An oxidation resistant structure comprising a titanium alloy substrate having thereupon a coating, said coating comprised of copper and from about 0 to 10 percent aluminum and from 0 to 6 percent silicon, provided that the percentages of aluminum and silicon are not simultaneously zero, said structure having substantially no intermetallic compound formation and substantially no diffusion of coating constituents in the substrate.

14. A structure as set forth in claim 13, wherein said substrate comprises a beta phase titanium alloy essentially free from the alpha phase and TiCr$_2$, containing more than 10 percent chromium, more than about 20 percent vanadium, and more than about 40 percent titanium.

15. A structure as set forth in claim 14, wherein said substrate comprises 35 percent vanadium, 15 percent chromium, at least 40 percent titanium, and up to 10 percent quaternary alloying elements.

16. A structure as set forth in claim 15, wherein said coating comprises an ion vapor deposited copper alloy selected from the group consisting of copper plus 4 to 10 percent aluminum, copper plus 3 to 6 percent silicon, and copper plus 1 to 10 percent aluminum plus 1 to 5 percent silicon.

17. A structure as set forth in claim 15, wherein said coating comprises a fully dense cathodic arc deposited copper alloy selected from the group consisting of copper plus 4 to 10 percent aluminum, copper plus 3 to 6 percent silicon, and copper plus 1 to 10 percent aluminum plus 1 to 5 percent silicon.

18. An oxidation resistant structure comprising a titanium alloy substrate having thereupon a coating comprising a copper alloy, wherein said copper alloy is selected from the group consisting of Cu-8Al, Cu-4Si, Cu-4Al-3Si, Cu-3Al-2Si, Cu-7Al-3.5Si, and Cu-4Al-2Si, said structure having substantially no intermetallic compound formation and substantially no diffusion of coating constituents in the substrate.

19. An oxidation resistant structure as set forth in claim 18, wherein said substrate comprises 35 percent vanadium, 15 percent chromium, at least 40 percent titanium, and up to 10 percent quaternary alloying elements.

20. An oxidation resistant structure as set forth in claim 19, wherein said coating is from about 0.5 to 2.0 mils in thickness.

21. An oxidation resistant structure comprising a titanium alloy substrate consisting essentially of titanium, vanadium and chromium, having thereupon a coating comprising a copper alloy, wherein said copper alloy is selected from the group consisting of Cu-8Al, Cu-4Si, Cu-4Al-3Si, Cu-3Al-2Si, Cu-7Al-3.5Si, and Cu-4Al-2Si said structure having substantially no intermetallic compound formation and substantially no diffusion of coating constituents in the substrate.

* * * * *